United States Patent
Yang et al.

(10) Patent No.: US 11,411,020 B2
(45) Date of Patent: Aug. 9, 2022

(54) MEMORY DEVICE WITH SUB-SLITS

(71) Applicant: MACRONIX International Co., Ltd., Hsinchu (TW)

(72) Inventors: Chih-Kai Yang, Kaohsiung (TW); Tzung-Ting Han, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/855,732

(22) Filed: Apr. 22, 2020

(65) Prior Publication Data

US 2021/0335801 A1 Oct. 28, 2021

(51) Int. Cl.
| | |
|---|---|
| H01L 27/11582 | (2017.01) |
| H01L 27/11565 | (2017.01) |
| H01L 27/11524 | (2017.01) |
| H01L 27/11556 | (2017.01) |
| H01L 27/11519 | (2017.01) |
| H01L 21/768 | (2006.01) |
| H01L 23/522 | (2006.01) |
| H01L 23/00 | (2006.01) |
| H01L 27/1157 | (2017.01) |

(52) U.S. Cl.
CPC .. *H01L 27/11582* (2013.01); *H01L 21/76802* (2013.01); *H01L 21/76877* (2013.01); *H01L 23/5226* (2013.01); *H01L 23/562* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC .......................................... H01L 27/115–11597
See application file for complete search history.

(56) References Cited

U.S. PATENT DOCUMENTS

| | | | |
|---|---|---|---|
| 2018/0240811 A1 | 8/2018 | Kim et al. | |
| 2018/0294273 A1* | 10/2018 | Liao | H01L 27/11582 |
| 2020/0144287 A1* | 5/2020 | Jung | H01L 21/76877 |
| 2021/0193574 A1* | 6/2021 | Sun | H01L 23/5283 |
| 2021/0265268 A1* | 8/2021 | Su | H01L 21/76816 |

OTHER PUBLICATIONS

"Office Action of Taiwan Counterpart Application", dated Mar. 4, 2022, pp. 1-4.

* cited by examiner

*Primary Examiner* — Ismail A Muse
*Assistant Examiner* — Gustavo G Ramallo
(74) *Attorney, Agent, or Firm* — J.C. Patents

(57) ABSTRACT

Provided is a memory device including a substrate, a stack structure, a first set of vertical channel structures, a second set of vertical channel structures, and a first slit. The stack structure is disposed on the substrate. The first and second sets of vertical channel structures are arranged along a Y direction and penetrate through the stack structure to contact the substrate. The first slit is disposed between the first and second sets of vertical channel structures, and penetrates through the stack structure to expose the substrate. The first slit includes a plurality of first sub-slits discretely disposed along a X direction.

18 Claims, 12 Drawing Sheets

A-A

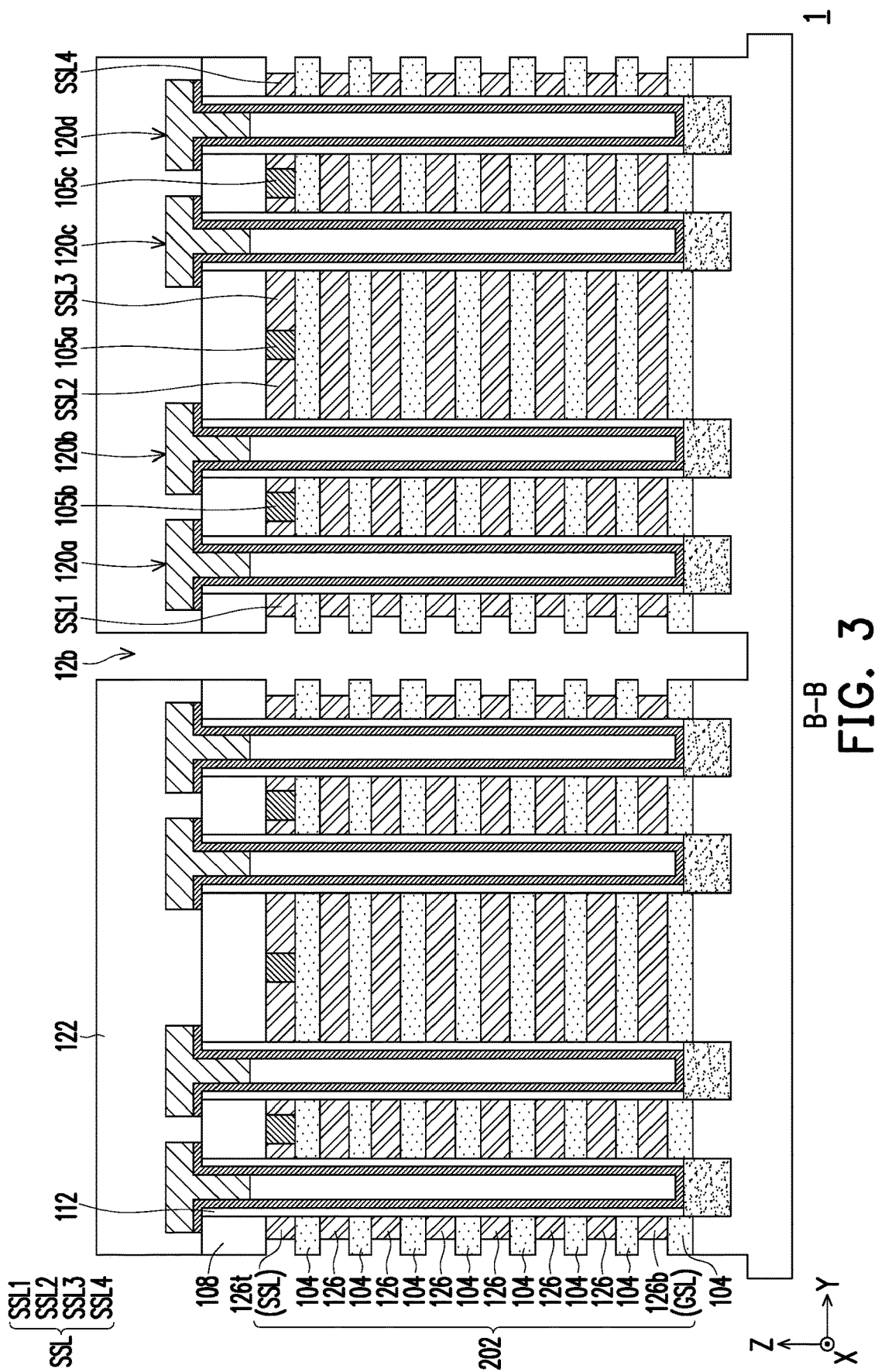
FIG. 3 B-B

MEMORY DEVICE WITH SUB-SLITS

BACKGROUND OF THE INVENTION

Field of the Invention

The present invention relates to a memory device and a method of manufacturing the same.

Description of Related Art

With the continuous development of science and technology, the demands for greater storage capacity also increase as electronic devices continue to improve. To satisfy the demands for high storage density, memory devices become smaller in size and have higher integrity. Therefore, the form of memory devices has developed from 2D memory devices having a planar gate structure to 3D memory devices having a vertical channel (VC) structure.

However, as the number of stacked layers of a composite film stack increases, the bending issue of a composite film stack with a high aspect ratio becomes more and more serious. The severe bending issue may even cause a short circuit between the bit line and the top word line, thereby affecting the operation of the memory device. Accordingly, how to develop a memory device with high integration density and a manufacturing method thereof to reduce the bending issue of the composite film stack will become an important subject in the future.

SUMMARY OF THE INVENTION

The invention provides a memory device and a method of manufacturing the same in which a slit between two sets of vertical channel structures is divided into a plurality of sub-slits to strengthen the mechanical strength of the memory device, thereby reducing the bending issue of the stack structure of the memory device.

The invention provides a memory device including a substrate, a stack structure, a first set of vertical channel structures, a second set of vertical channel structures, and a first slit. The stack structure is disposed on the substrate. The first and second sets of vertical channel structures are arranged along a Y direction and penetrate through the stack structure to contact the substrate. The first slit is disposed between the first and second sets of vertical channel structures, and penetrates through the stack structure to expose the substrate. The first slit includes a plurality of first sub-slits discretely disposed along a X direction.

In one embodiment of the invention, the substrate includes an array region and a stair-step region, the first and second sets of vertical channel structures are disposed on the substrate in the array region.

In one embodiment of the invention, the memory device further includes a first string select line cut between the plurality of discrete first sub-slits.

In one embodiment of the invention, the first string select line cut extends at least beyond a first column of contacts in the stair-step region.

In one embodiment of the invention, the stack structure includes a plurality of conductive layers and a plurality of dielectric layers stacked alternately along a Z direction, a topmost conductive layer is a string select line (SSL) to control the switch of the first and second sets of vertical channel structures.

In one embodiment of the invention, the memory device further includes a second string select line cut embedded in the string select line and extending along the X direction to divide the first set of vertical channel structures into two first groups; and a third string select line cut embedded in the string select line and extending along the X direction to divide the second set of vertical channel structures into two second groups.

In one embodiment of the invention, the memory device further includes two second slits respectively disposed at a first side of the first set of vertical channel structures and a second side of the second set of vertical channel structure which opposite to the first side, and the two second slits penetrating through the stack structure to expose the substrate, wherein the two second slits continuously extend from the array region into the stair-step region along the X direction respectively.

In one embodiment of the invention, a length of one of the two second slits is greater than a sum of lengths of the first sub-slits.

In one embodiment of the invention, a ratio of a sum of lengths of the first sub-slits to a length of one of the two second slits is in a range of 0.35 to 0.9.

In one embodiment of the invention, the memory device further includes a third set of vertical channel structures and a fourth set of vertical channel structures, arranged along the Y direction with the first and second sets of vertical channel structures and penetrating through the stack structure to contact the substrate; a third slit, disposed between the second and third sets of vertical channel structures, and penetrating through the stack structure to expose the substrate, wherein the third slit comprises a plurality of third sub-slits discretely disposed along the X direction; and a fourth slit, disposed between the third and fourth sets of vertical channel structures, and penetrating through the stack structure to expose the substrate, wherein the fourth slit comprises a plurality of fourth sub-slits discretely disposed along the X direction.

In one embodiment of the invention, the memory device further includes a fourth string select line cut embedded in the string select line and disposed between the plurality of third sub-slits.

The invention provides a method of manufacturing a memory device including: forming a stack layer on a substrate, wherein the stack layer comprises a plurality of first materials and a plurality of second materials; forming a string select line cut extending along a X direction in a topmost second material; respectively forming a first set of vertical channel structures and a second set of vertical channel structures at two sides of the string select line cut, the first and second sets of vertical channel structures penetrating through the stack layer to contact the substrate; and forming a first slit between the first and second sets of vertical channel structures, wherein the first slit penetrates through the stack structure to expose the substrate, the first slit comprises a plurality of first sub-slits discretely disposed along the X direction, and the string select line cut is divided into a plurality of first string select line cuts by the firs slit, wherein the plurality of first string select line cuts is located between the plurality of first sub-slits and discretely disposed along the X direction.

In one embodiment of the invention, the method further includes performing an etching process to remove the plurality of second materials, so as to form a plurality of gaps between the plurality of first materials; and forming a plurality of conductive layers in the plurality of gaps, so that the plurality of conductive layers surround the first and second sets of vertical channel structures.

In one embodiment of the invention, the forming the string select line cut includes forming a second string select line cut to divide the first set of vertical channel structures into two first groups; and forming a third string select line cut to divide the second set of vertical channel structures into two second groups.

In one embodiment of the invention, the substrate includes an array region and a stair-step region, the first and second sets of vertical channel structures are formed on the substrate in the array region, and the plurality of first string select line cuts and the first slit are formed to extend from the array region into the stair-step region.

In one embodiment of the invention, the forming the first slit includes respectively forming two second slits at a first side of the first set of vertical channel structures and a second side of the second set of vertical channel structure which opposite to the first side, the two second slits penetrating through the stack layer to expose the substrate, wherein the two second slits continuously extend from the array region into the stair-step region along the X direction respectively.

In one embodiment of the invention, the forming the first and second sets of vertical channel structures includes forming a plurality of sets of dummy vertical channel structures penetrating through the stack layer in the stair-step region to contact the substrate in the stair-step region.

In one embodiment of the invention, the plurality of first string select line cuts and the plurality of second materials have different materials or materials with different etching selectivies.

The invention provides a memory device including a substrate, a stack structure, a first set of vertical channel structures, a second set of vertical channel structures, and an isolation structure. The stack structure is disposed on the substrate. The first and second sets of vertical channel structures are arranged along a Y direction and penetrating through the stack structure to contact the substrate. The isolation structure is disposed between the first and second sets of vertical channel structures. The isolation structure includes a plurality of sub-slits and a plurality of string select line cuts arranged alternately along a X direction.

In one embodiment of the invention, the memory device further includes a second slit disposed at a first side of the first set of vertical channel structures and penetrating through the stack structure to expose the substrate, wherein the second slit continuously extend along the X direction, and a length of the second slit is greater than a sum of lengths of the plurality sub-slits.

Based on the above, in the embodiment of the present invention, the continuously extending first slit is replaced with the plurality of first sub-slits arranged discretely along the X direction. In the case of the stack structure with a high aspect ratio, the first string select line cut and a portion of the stack structure between the first sub-slits is able to strengthen the mechanical strength of the memory device, so as to reduce the bending issue of the stack structure during a series of processes (e.g., a wet etching processes, a film deposition process, a thermal process, or the like), thereby enhance the yield and reliability of the memory device. In addition, the first sub-slits and the first string select line cuts therebetween may be regarded as an isolation structure to electrically separate the first set of vertical channel structures from the second set of vertical channel structures, thereby increasing the flexibility of the operation of the memory device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a schematic cross-sectional view along a line B-B of FIG. 1.

DESCRIPTION OF THE EMBODIMENTS

Figure 1:
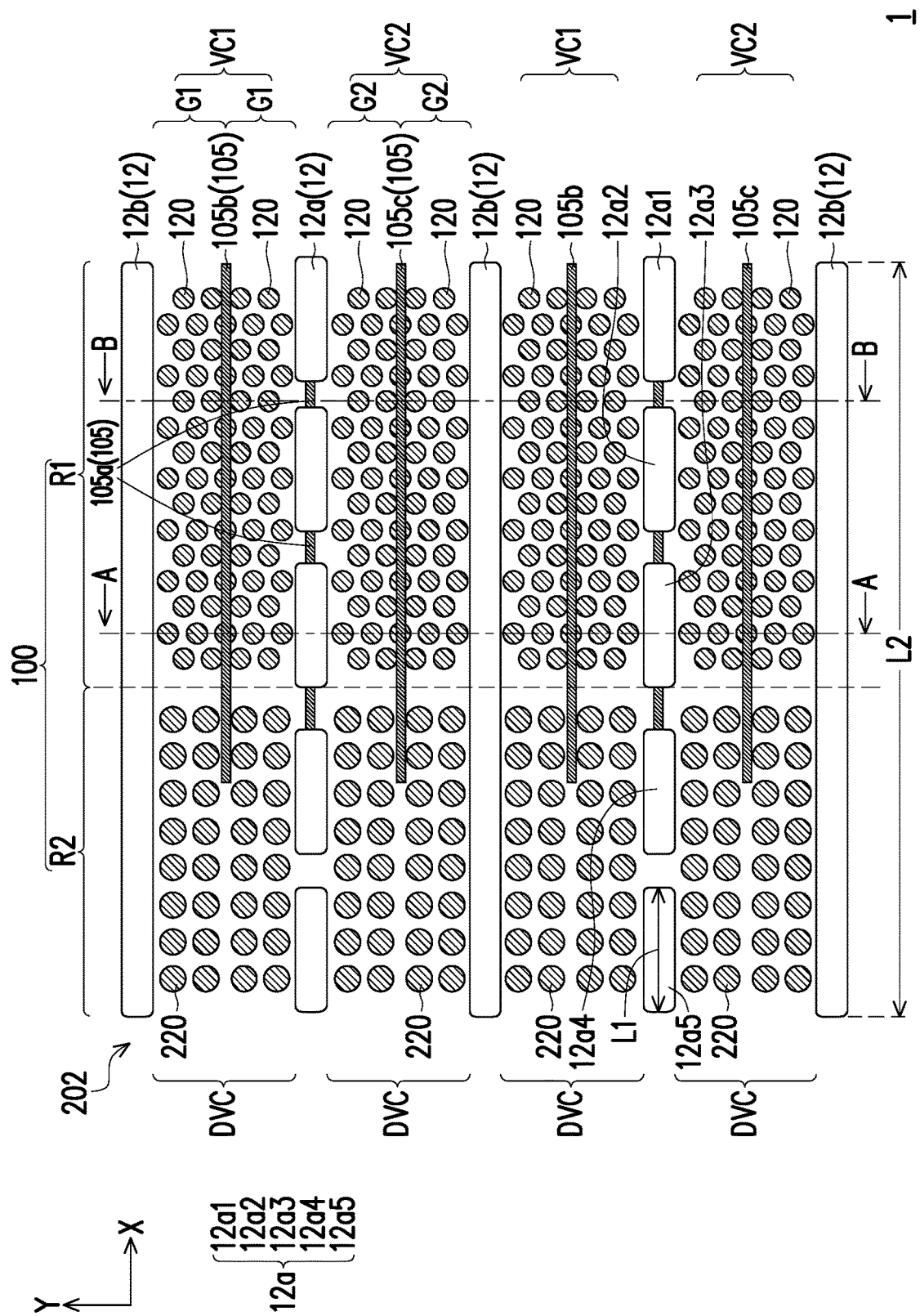
FIG. 1 is a schematic top view of a memory device according to a first embodiment of the invention.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1 is a schematic top view of a memory device according to a first embodiment of the invention. The memory device described in the following embodiments may be a NAND flash memory. However, the invention is not limited thereto. In other embodiments, the memory device may also be a NOR flash memory, a ROM memory, or other three-dimensional (3D) memory.

Referring to FIG. 1, a memory device 1 of the first embodiment of the present invention includes a substrate 100, a stack structure 202, a first set of vertical channel structures VC1, a second set of vertical channel structures VC2, a plurality of sets of dummy vertical channel structures DVC, a plurality of first slits 12a and a plurality of second slits 12b. Specifically, the substrate 100 includes a first region R1 and a second region R2. In some embodiments, the first region R1 may be an array region having a memory array, which is hereinafter referred to as an array region R1. The second region R2 may be a stair-step region, which has a plurality of contacts to respectively electrically connect to the word lines, which is hereinafter referred to as a stair-step region R2. The stack structure 202 is disposed on the substrate 100 (as shown in FIG. 2I). The first set of vertical channel structures VC1 and the second set of vertical channel structures VC2 are arranged in the array region R1 and arranged along a Y direction. Although only two first set of vertical channel structures VC1 and two second set of vertical channel structures VC2 are illustrated in FIG. 1, the present invention is not limited thereto. In other embodiments, multiple first set of vertical channel structures VC1 and multiple second set of vertical channel structures VC2 may be arranged along the Y direction. The first set of vertical channel structures VC1 and the second set of vertical channel structures VC2 include a plurality of vertical channel structures 120. In some embodiments, the vertical channel structures 120 are arranged in a hexagonal closed packing (HCP) configuration to improve the integration density of the memory cells. The vertical channel structures 120 penetrate through the stack structure 202 of the array region R1 to contact the substrate 100 (as shown in FIG. 2I). In the embodiment, the vertical channel structures 120 may be electrically connected to the bit lines. On the other hand, the plurality of sets of dummy vertical channel structures DVC are arranged in the stair-step region R2 and are arranged along the Y direction. The plurality of sets of dummy vertical channel structures DVC includes a plurality of dummy vertical channel structures 220. In some embodiments, the dummy vertical channel structures 220 are arranged in an m×n array. The dummy vertical channel structures 220 penetrate through the stack structure 202 of the stair-step region R2 to contact the substrate 100 of the stair-step region R2. In the embodiment, the dummy vertical channel structures 220 are electrically floating or are not electrically connected to other external power sources (e.g., the bit lines). In some embodiments, an arrangement density of dummy vertical channel structures 220 is less than an arrangement density of vertical channel structures 120. The dummy vertical channel structures 220 may be used to support the strength of the stack layer of the stair-step region R2 to avoid the stack layer from collapsing during the subsequent etching process of FIGS. 2G to FIG. 2H.

In some embodiments, the first slits 12a are disposed between the first set of vertical channel structures VC1 and the second set of vertical channel structures VC2, and penetrate through the stack structure 202 to expose the substrate 100 (as shown in FIG. 2I). As shown in FIG. 1, the first slits 12a extend from the array region R1 to the stair-step region R2 along a X direction. It should be noted that one of the first slits 12a include a plurality of first sub-slits 12a1, 12a2, 12a3, 12a4, and 12a5, which are discretely arranged along the X direction. In addition, the memory device 1 further includes a first string select line cut 105a, which is located between first sub-slits 12a1, 12a2, 12a3, 12a4, and 12a5. That is, the first sub-slits 12a1, 12a2, 12a3, 12a4, and 12a5 are separated in the X direction by the first string select line cut 105a and a portion of the stack structure 202. In the case, the first string select line cut 105a and the portion of the stack structure 202 between the first sub-slits 12a1, 12a2, 12a3, 12a4, and 12a5 is able to strengthen the mechanical strength of the whole memory device 1, thereby reducing the bending issue of the stack structure 202 of the memory device 1. From another perspective, the first sub-slits 12a1, 12a2, 12a3, 12a4, and 12a5 and the first string select line cut 105a there-between may be regarded as an isolation structure to separate the first set of vertical channel structures VC1 and the second set of vertical channel structures VC2. In some embodiments, the isolation structure (including the first sub-slits 12a1, 12a2, 12a3, 12a4, and 12a5 and the first string select line cut 105a arranged alternately along the X direction) extends from the array region R1 to the stair-step region R2. In the embodiment, the first string select line cut 105a extends at least beyond a first column of contacts (not shown) in the stair-step region R2.

In some embodiments, the second slits 12b are configured on a first side (e.g., an upper side) of the first set of vertical channel structures VC1 and a second side (e.g., a lower side) of the second set of vertical channel structures VC2 which is opposite to the first side. Specifically, the second slits 12b also penetrate the stack structure 202 to expose the substrate 100 (as shown in FIG. 2I). As shown in FIG. 1, the second slits 12b continuously extend from the array region R1 to the stair-step region R2 along the X direction.

In addition, the memory device 1 further includes a second string select line cut 105b and a third string select line cut 105c. As shown in FIG. 1, the second string select line cut 105b extends from the array region R1 to the stair-step region R2 along the X direction to divide the first set of vertical channel structures VC1 into two first groups G1. In some embodiments, each first group G1 has the same number of vertical channel structures 120. In the embodiment, the second string select line cut 105b extends at least beyond the first column of contacts (not shown) in the stair-step region R2. Similarly, the third string select line cut 105c extends from the array region R1 to the stair-step region R2 along the X direction to divide the second set of vertical channel structures VC2 into two second groups G2. In some embodiments, each second group G2 has the same number of vertical channel structures 120. In the embodiment, the third string select line cut 105c extends at least beyond the first column of contacts (not shown) in the stair-step region R2.

In the embodiment, the first slit 12a extends discontinuously along the X direction; and the second slit 12b extends continuously along the X direction. Accordingly, a length L2 of the second slit 12b is greater than a sum of lengths L1 of the first sub-slits 12a1, 12a2, 12a3, 12a4, and 12a5. In addition, a ratio of the sum of the length L1 of the first sub-slits 12a1, 12a2, 12a3, 12a4, and 12a5 to the length L2 of the second slits 12b may be in a range of 0.35 to 0.9. Although the first sub-slits 12a1, 12a2, 12a3, 12a4, and 12a5 illustrated in FIG. 1 have the same length L1, the invention is not limited thereto. In other embodiments, the first sub-slits 12a1, 12a2, 12a3, 12a4, and 12a5 may have different lengths and may be spaced from each other with different pitches.

FIG. 2A to FIG. 2I are schematic cross-sectional views illustrating a manufacturing process of the memory device along a line A-A of FIG. 1. FIG. 3 is a schematic cross-sectional view along a line B-B of FIG. 1.

Figure 2A:
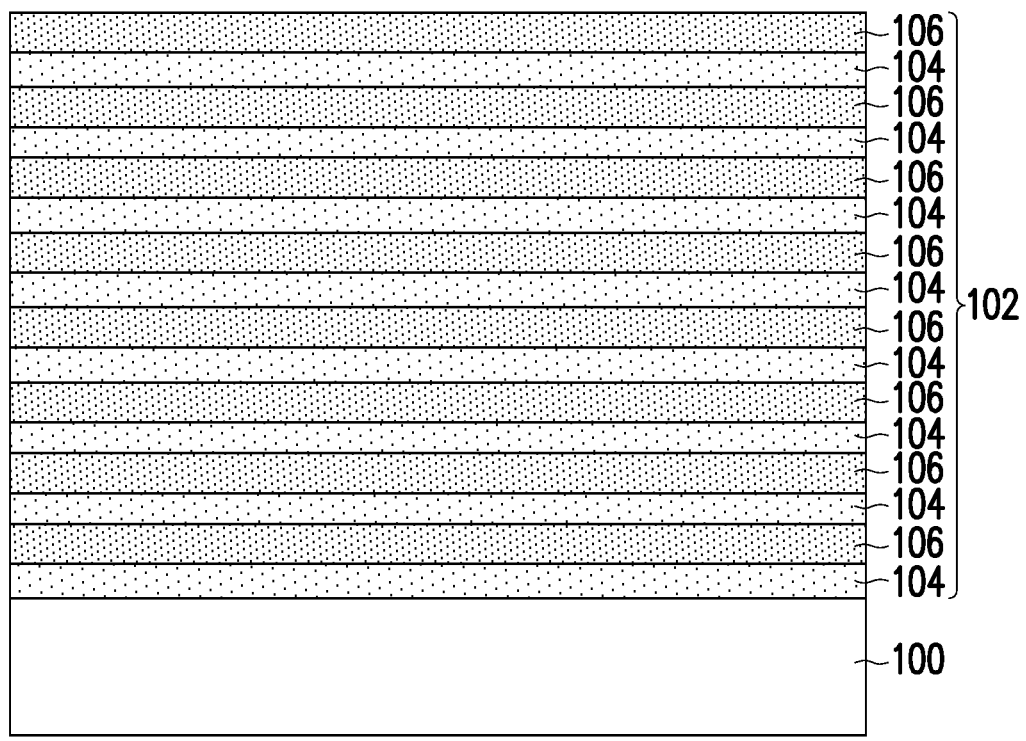
FIG. 2A to FIG. 2I.

Referring to FIG. 2A. a manufacturing method of the memory device 10 (as shown in FIG. 1) is shown as below. First, the substrate 100 is provided. In one embodiment, the substrate 100 includes a semiconductor substrate, such as a silicon substrate.

Next, a stack layer 102 is formed on the substrate 100. Specifically, the stack layer 102 includes a plurality of first materials 104 and a plurality of second materials 106 stacked alternately. In one embodiment, the first materials 104 and the second materials 106 may have different dielectric materials. For example, the first materials 104 may be silicon oxide; the second materials 106 may be silicon nitride. However, the present invention is not limited to this. In other embodiments, the first materials 104 may be silicon oxide; the second materials 106 may be polysilicon. In one embodiment, the number of the first materials 104 and the number of the second materials 106 may be 8 layers, 16 layers, 32 layers, 64 layers, 72 layers or more layers.

Figure 2B:
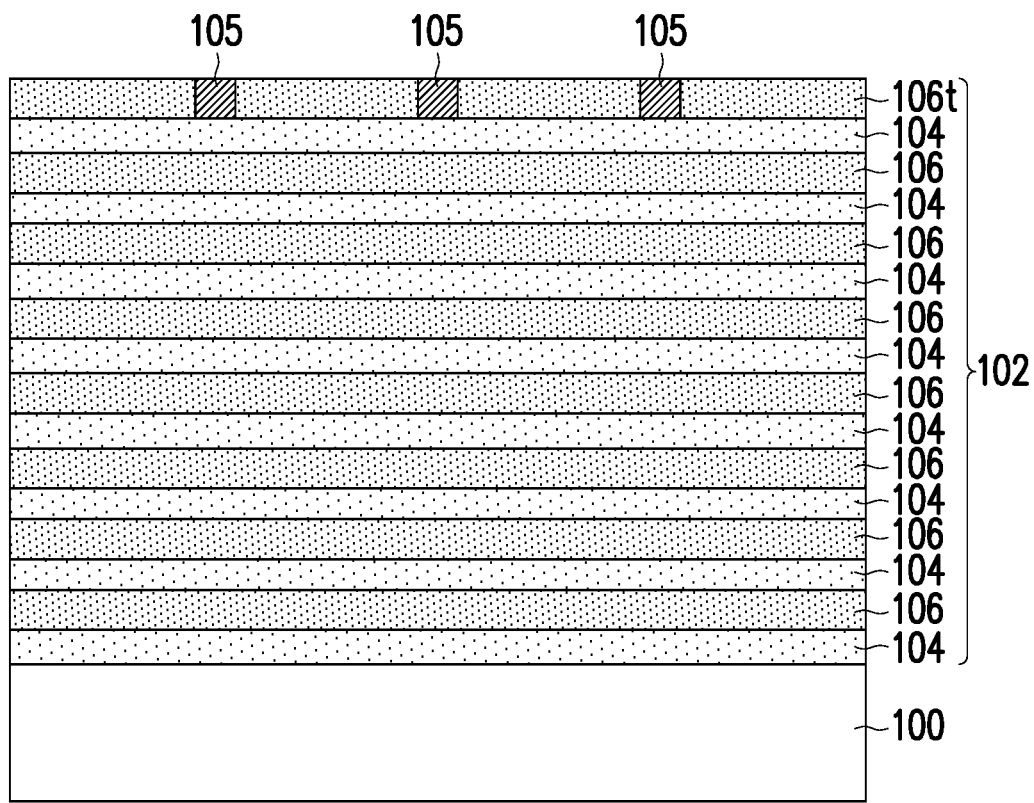

Referring to FIG. 2B, a plurality of string select line cuts 105 extending along the X direction are formed in the topmost second material 106t. In some embodiments, a method for forming the string select line cuts 105 includes patterning the topmost second material 106t to form openings; filling a dielectric material into the openings, wherein the dielectric material covers the top second material 106t; and performing a chemical mechanical polishing (CMP) process to expose the topmost second material 106t. In some embodiments, the string select line cuts 105 have a dielectric material different from the second materials 106, such as silicon oxide, high dielectric constant material (e.g., aluminum oxide), or a combination thereof.

Figure 2C:
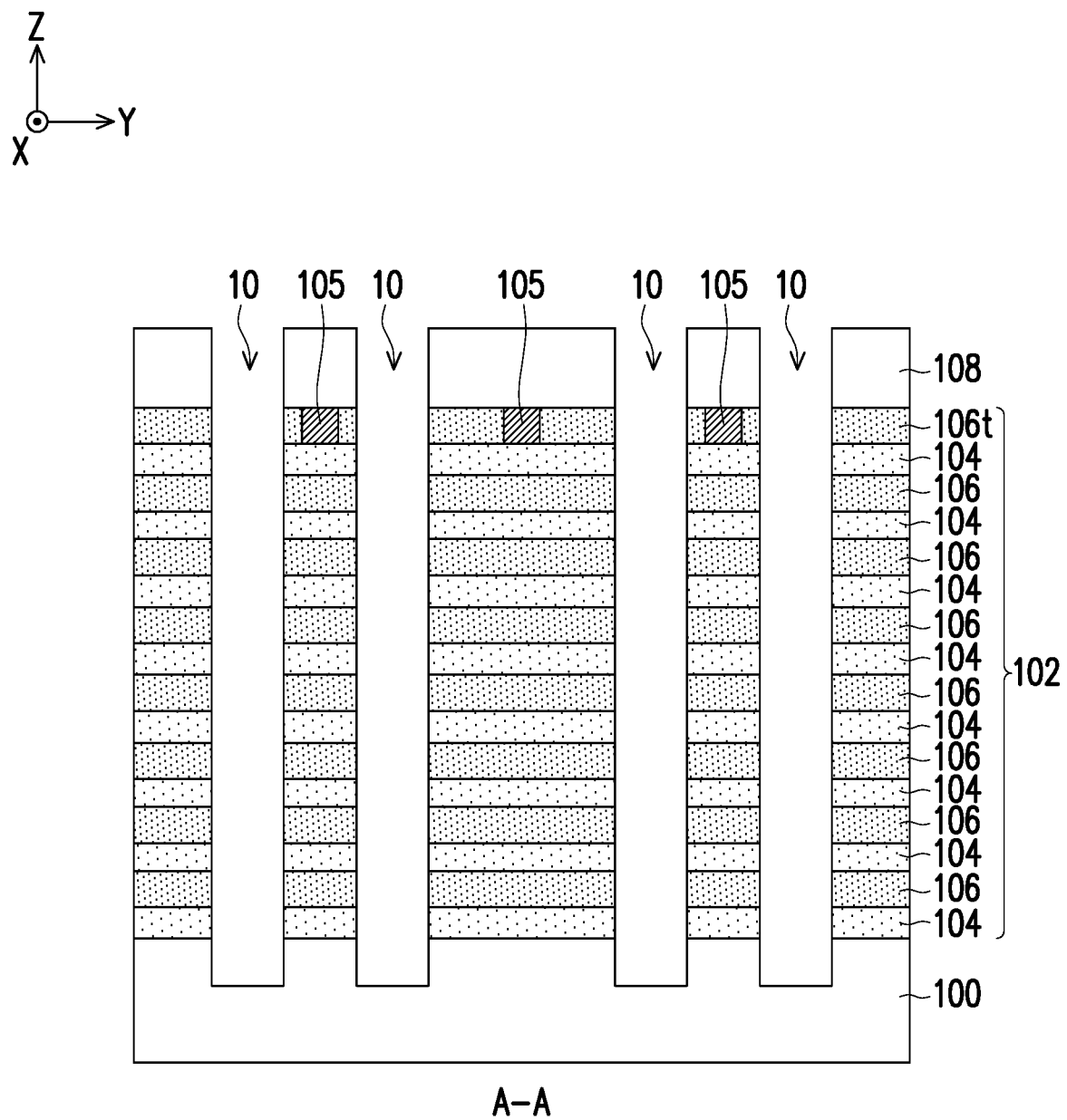

Referring to FIG. 2C, a dielectric layer 108 is formed on the stack layer 102. In some embodiments, a material of the dielectric layer 108 includes a dielectric material different from the second materials 106, such as silicon oxide, high dielectric constant material (e.g., aluminum oxide), or a combination thereof. Next, a plurality of openings 10 are formed in the dielectric layer 108 and the stack layer 102. The openings 10 are located between the string select line cuts 105 and penetrate the stack layer 102, thereby exposing a portion of the substrate 100. In one embodiment, a method for forming the openings 10 includes performing a patterning process on the dielectric layer 108 and the stack layer 102. In order to completely remove a bottommost layer of the stack layer 102, a portion of the substrate 100 would be removed during the patterning process. In the case, as shown in FIG. 2C, bottom surfaces of the openings 10 may be lower than a top surface of the substrate 100.

Figure 2D:
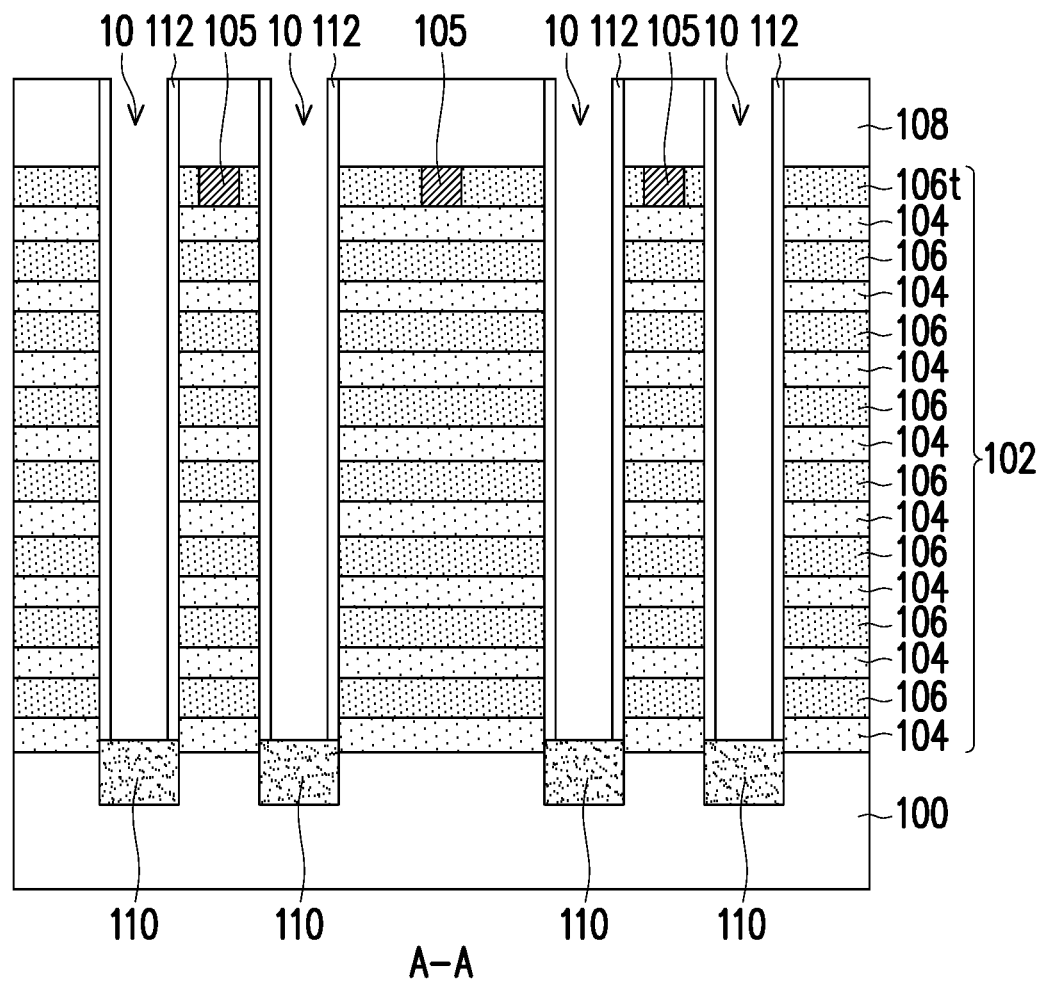

Referring to FIG. 2C and FIG. 2D, epitaxial layers 110 are selectively epitaxially grown on the substrate 100 exposed by the openings 10. In one embodiment, a material of the epitaxial layers 110 may be derived from the substrate 100, such as epitaxial silicon. The epitaxial layers 110 may increase the conductive area to reduce the resistance. Although top surfaces of the epitaxial layers 110 shown in FIG. 2D is higher than the top surface of the substrate 100, the present invention is not limited thereto. In other embodiments, the top surfaces of the epitaxial layers 110 may be lower than or equal to the top surface of the substrate 100.

Next, a charge storage structure 112 is formed in the openings 10. In detail, a charge storage material (not shown) is formed on the substrate 100. The charge storage material conformally covers the top surfaces of the dielectric layer 108, sidewalls of the stack layer 102 and the top surface of the epitaxial layers 110. Thereafter, an etching process is performed to remove the charge storage material on the top surfaces of the epitaxial layers 110 and the top surface of the dielectric layer 108, so that the charge storage structure 112 is formed on the sidewalls of the openings 10 in the dielectric layer 108 and the stack layer 102 in the form of a spacer. In one embodiment, the charge storage structure 112 may be a composite layer of oxide layer/nitride layer/oxide layer (ONO). In one embodiment, the etching process includes an anisotropic etching process, such as a reactive ion etching (RIE) process.

Figure 2E:
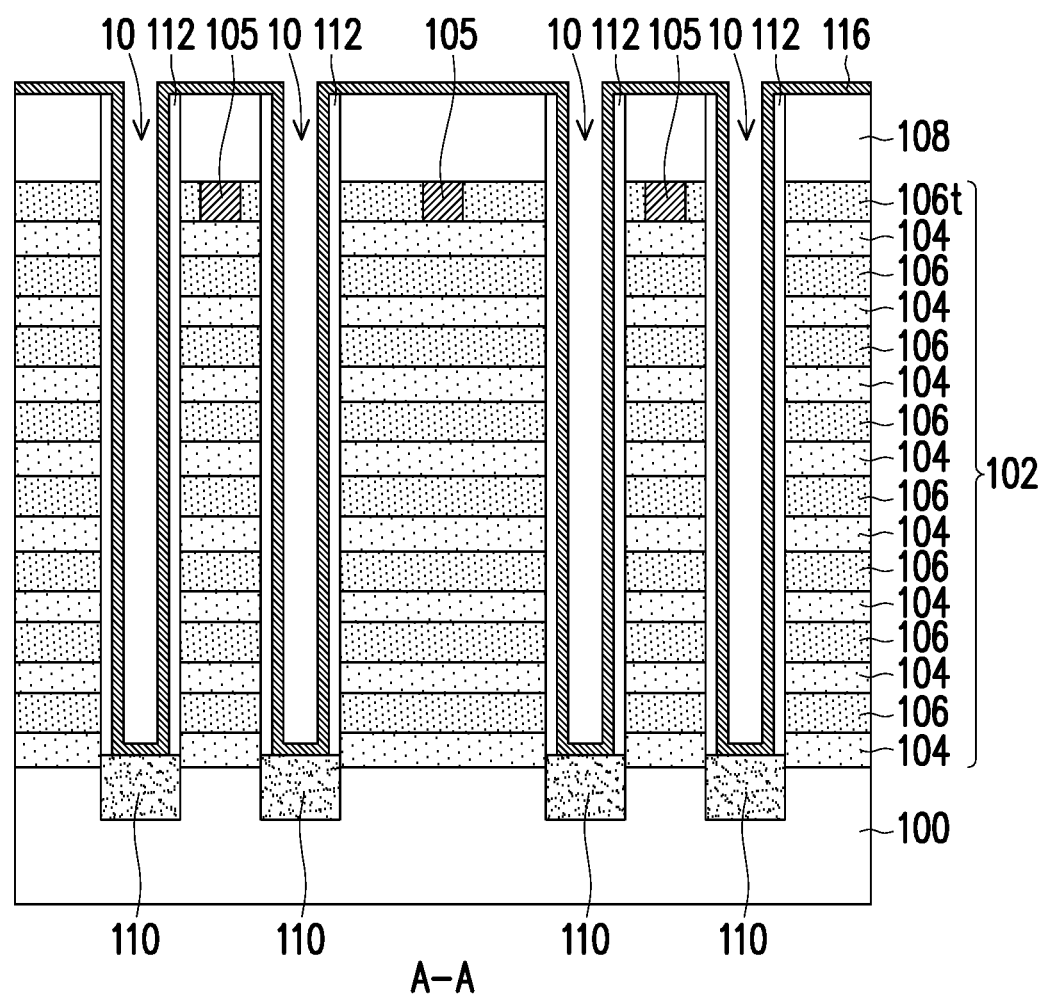

Referring to FIG. 2E, a first channel material 116 is formed on the substrate 100. The first channel material 116 conformally covers the top surfaces of the epitaxial layers 110, a surface of the charge storage structure 112, and the top surface of the dielectric layer 108. In an embodiment, the first channel material 116 includes a semiconductor material, which may be polysilicon, for example. A method of forming the first channel material 116 is a chemical vapor deposition (CVD) method, for example.

Figure 2F:
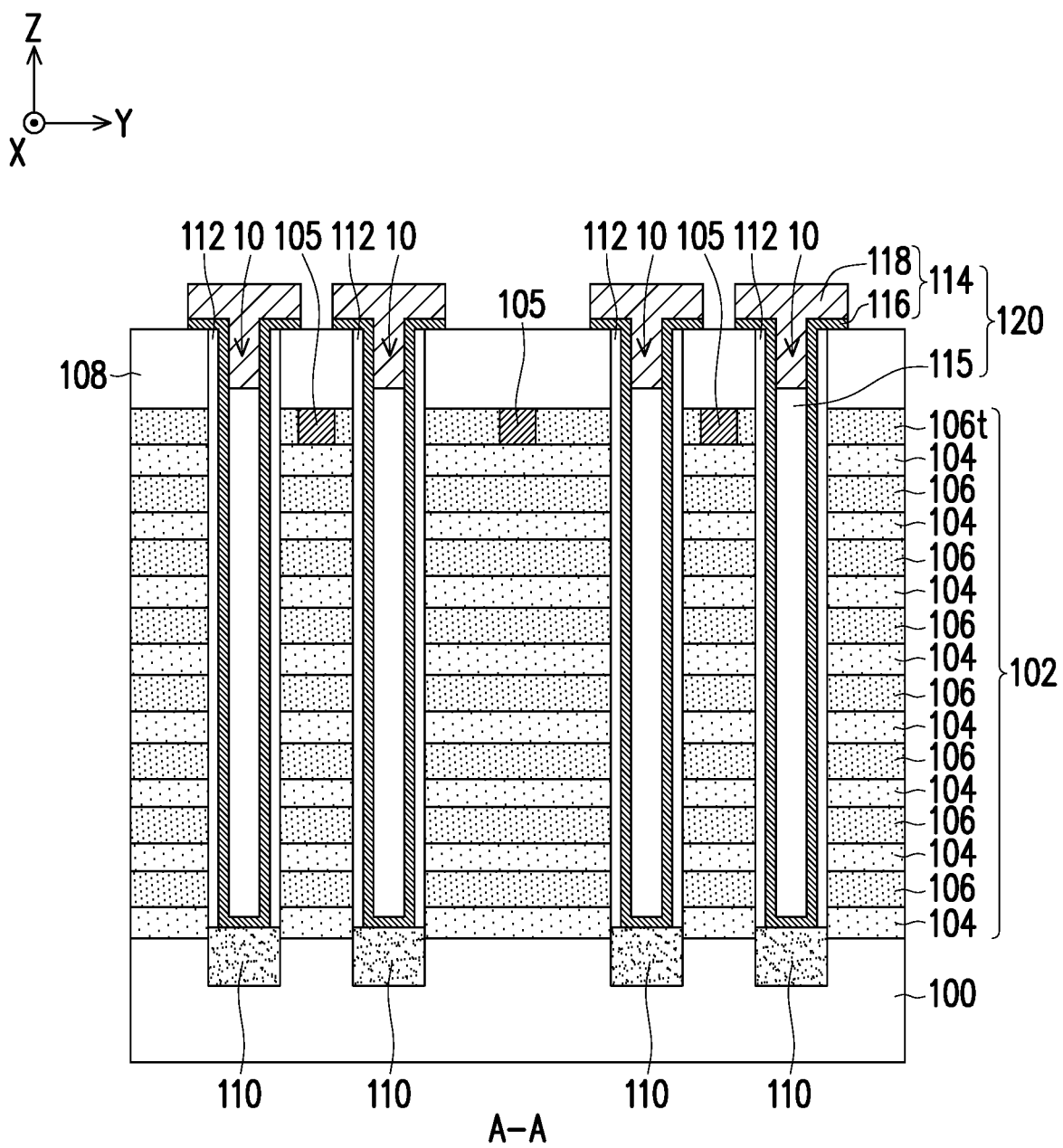

Referring to FIG. 2E and FIG. 2F, dielectric pillars 115 are formed in the openings 10. The dielectric pillars 115 fill the openings 10, and top surfaces of the dielectric pillars 115 may be lower than the top surface of the dielectric layer 108. That is, the electrical pillars 115 do not fill up the openings 10. In one embodiment, materials of the dielectric pillars 115 include spin-on-dielectric (SOD). Thereafter, a second channel material 118 is formed on the dielectric pillars 115 to cover the top surfaces of the dielectric pillars 115 and extend to cover the top surface of the dielectric layer 108. Next, the second channel material 118 and the first channel material 116 are patterned to form vertical channel structures 120. As shown in FIG. 2F, one of the vertical channel structures 120 includes the dielectric pillar 115 and a channel layer 114 composed of the first channel material 116 and the second channel material 118, wherein the dielectric pillar 115 is encapsulated by the channel layer 114. The charge storage structure 112 surrounds sidewalls of the vertical channel structures 120. In an embodiment, the second channel material 118 includes a semiconductor material, which may be polysilicon, for example. A method for forming the second channel material 118 is CVD, for example.

Figure 2G:
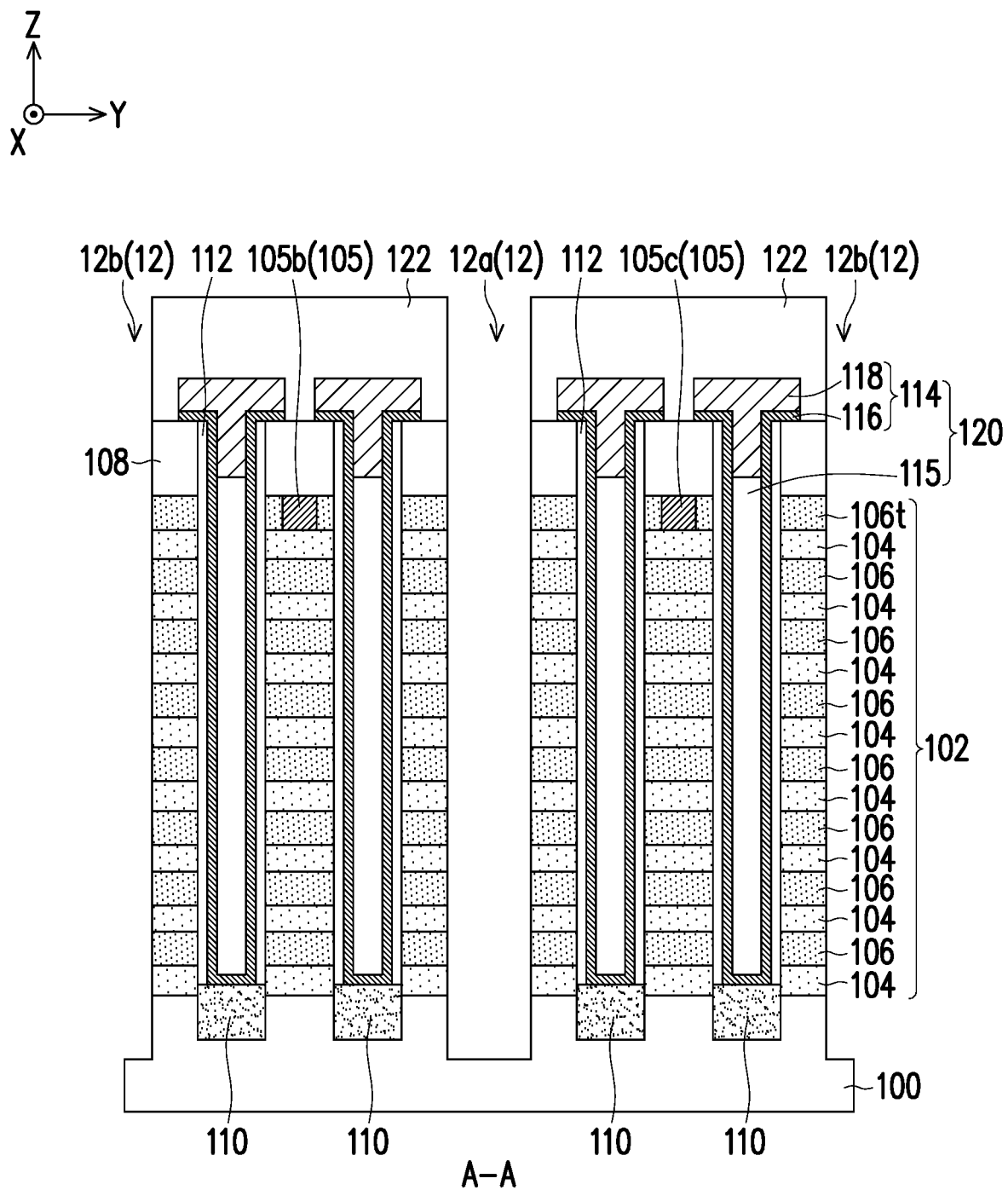

Referring to FIG. 2F and FIG. 2G, a dielectric layer 122 is formed over the substrate 100 to cover the top surface of the dielectric layer 108 and the top surfaces of the vertical channel structures 120. In an embodiment, the dielectric layer 122 includes, but is not limited to, silicon oxide, and a forming method thereof is CVD, for example. After the dielectric layer 122 is formed, slits 12 are formed in the stack layer 102 between two adjacent vertical channel structures 120. The slits 12 penetrate the dielectric layers 122 and 108 and the stack layer 102 and expose a portion of the substrate 100. In order to completely remove the bottommost layer of the stack layer 102, a portion of the substrate 100 would be removed when the splits 12 are formed. In the case, the bottom surface of the slits 12 may be lower than the top surface of the substrate 100. Corresponding to the top view of FIG. 1, the slits 12 include the first slit 12a and the second slits 12b. The first slit 12a include the plurality of first sub-slits 12a1, 12a2, 12a3, 12a4, and 12a5 arranged discretely along the X direction. The first sub-slits 12a1, 12a2, 12a3, 12a4, and 12a5 separate the string select line cuts 105 that originally extend continuously along the X direction into a plurality of first string select line cuts 105a, as shown in FIG. 1. In some embodiments, the first sub-slits 12a1, 12a2, 12a3, 12a4, and 12a5 may laterally expose the first string select line cut 105a. Since a portion of a position of the string select line cuts 105 has been replaced by the first slit 12a, the first string select line cut 105a is not shown in the cross-sectional view of FIG. 2G. In the case, the string select line cuts 105 shown in the cross-sectional view of FIG. 2G may be regarded as the second string select line cut 105b and the third string select line cut 105c. As shown in FIG. 1, the second string select line cut 105b and the third string select line cut 105c continuously extend from the array region R1 to the stair-step region R2.

Figure 2H:
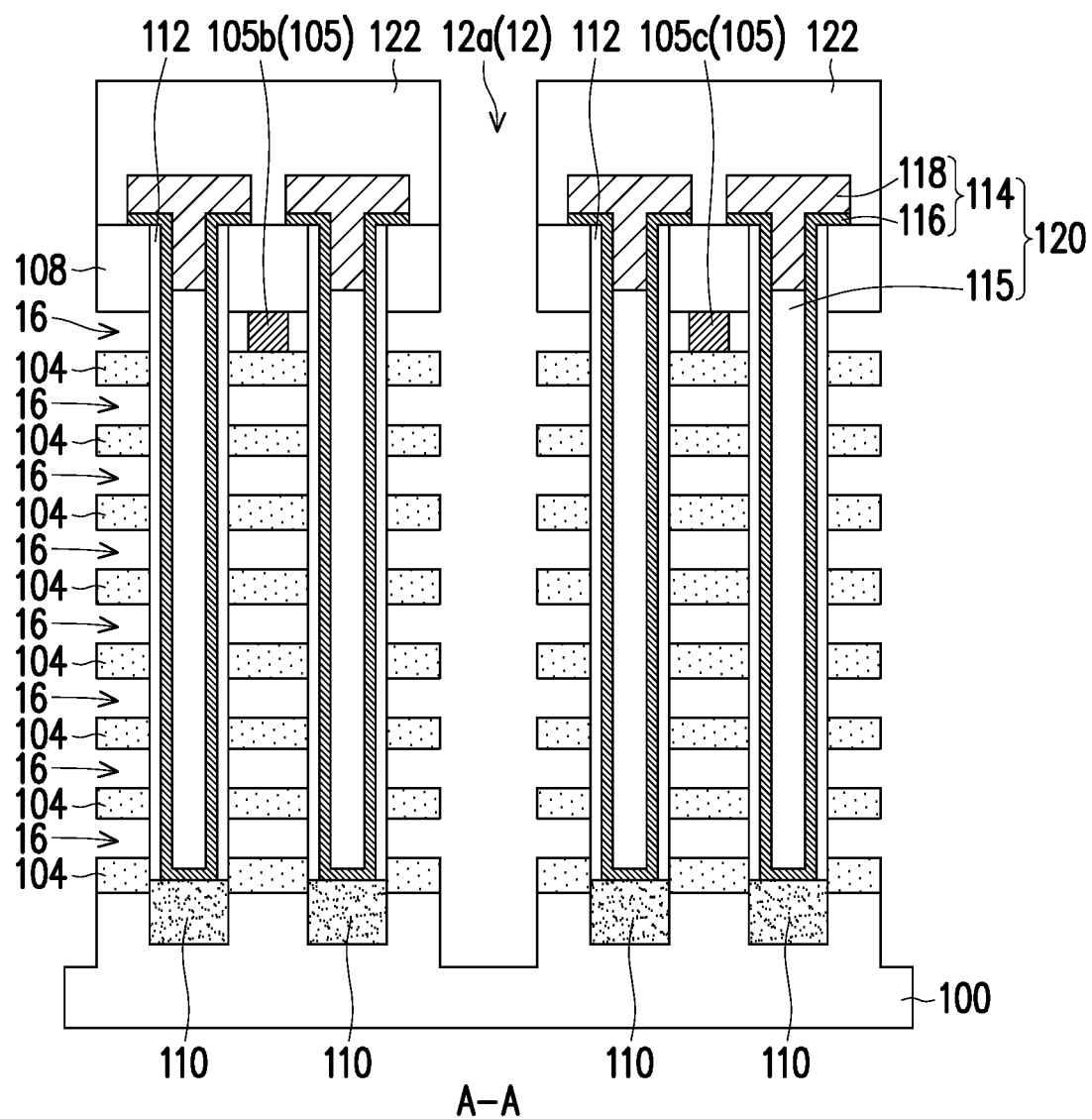
Figure 2I:
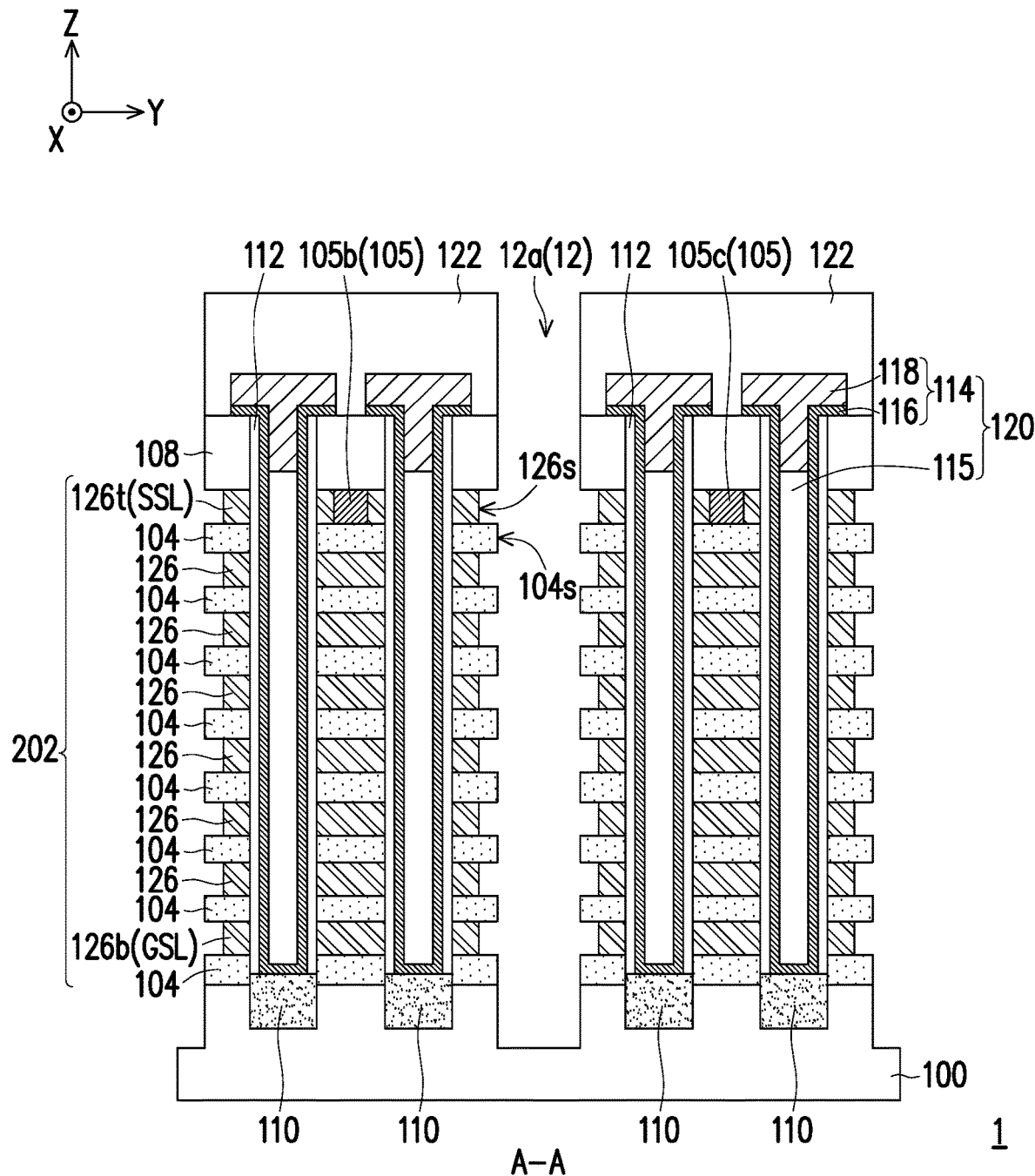

Referring to FIG. 2G and FIG. 2H, an etching process is performed to remove the second materials 106 to form a plurality of gaps 16 between the first materials 104. The gaps 16 laterally expose a portion of the sidewall of the charge storage structure 112. That is, the gap 16 is defined by the first materials 104 and the charge storage structure 112. In one embodiment, the etching process may be a wet etching process. For example, when the second materials 106 are silicon nitride, the etching process may use an etching solution containing phosphoric acid and pour the etching solution into the slits 12 to remove the second materials 106. Since the etching solution has high etching selectivity for the second materials 106, the second materials 106 may be completely removed, while the first materials 104 and the charge storage structure 112 are not removed or are merely slightly removed. It should be noted that since the material of the string select line cuts 105 and the second materials 106 have different etch selectivities, the string select line cuts 105 are not removed or are merely slightly removed. In the case, as shown in FIG. 2H, the second string select line cut 105b and the third string select line cut 105c are both exposed by the gaps 16.

Referring to FIG. 2H and FIG. 2I, conductive layers 126 are formed in the gap 16. In one embodiment, a method for forming the conductive layers 126 includes forming a conductive material (not shown) over the substrate 100. The conductor material fills in the gap 16 and covers the sidewalls of the first materials 104 and the sidewalls of the dielectric layers 108 and 122. Thereafter, an etching process is performed to remove the conductive material on the sidewalls of the first materials 104 and the sidewalls of the dielectric layers 108 and 122. In order to completely remove the conductive materials on the sidewalls of the first materials 104 and the sidewalls of the dielectric layers 108 and 122, a portion of the conductive material in the gaps 16 will be removed during the etching process. In the case, as shown in FIG. 2I, sidewalls 126s of the formed conductive layers 126 are recessed from sidewalls 104s of the first materials 104. In an embodiment, a material of the conductive layers 126 includes a metal, a barrier metal, polysilicon, or a combination thereof, and the conductive layers 126 may be formed by CVD or physical vapor deposition (PVD).

Referring to FIG. 2I and FIG. 3, the memory device 1 of the present embodiment includes the substrate 100, the stack structure 202, the vertical channel structures 120, and the charge storage structure 112. The stack structure 202 is disposed on the substrate 100. The stack structure 202 includes the plurality of first materials (which may be dielectric layers, for example) 104 and the plurality of conductive layers 126 stacked alternately along a Z direction. The vertical channel structures 120 penetrate through the stack structure 202. The charge storage structure 112 wraps the sidewalls of the vertical channel structures 120. In an embodiment, the memory device 1 may be a gate-all-around (GAA) memory device. That is, the conductive layers 126 may be regarded as gates or word lines, and the vertical channel structures 120 may be regarded as a channel for current flow. In alternative embodiments, the memory device 1 may be a NAND memory device.

In some embodiments, a topmost conductive layer 126t may be used as a string select line (SSL). The string select line SSL may be electrically connected to a selection transistor to control the switch of the vertical channel structures 120 surrounded by the string select line SSL. Although only one layer of the string select line SSL illustrated in FIG. 2I and FIG. 3, the present invention is not limited thereto. In other embodiments, the topmost conductive layer 126t and the underlying conductive layer 126 may be used as string select lines. It should be noted that the first string select line cut 105a, the second string select line cut 105b, and the third string select line cut 105c are all embedded in the string select line SSL to separate the string select line SSL into four string select lines SSL1, SSL2, SSL3, SSL4, as shown in FIG. 3. FIG. 3 is the cross section along line B-B shown in FIG. 1. In the case, the string select lines SSL1, SSL2, SSL3, and SSL4 are electrically isolated from each other. In detail, the string select line SSL1 wraps the vertical channel structure 120a and is used to control the switch of the vertical channel structure 120a. Similarly, the string select line SSL2 wraps the vertical channel structure 120b and is used to control the switch of the vertical channel structure 120b; the string select line SSL3 wraps the vertical channel structure 120c and is used to control the switch of the vertical channel structure 120c; the string select line SSL4 wraps the vertical channel structure 120d and is used to control the switch of the vertical channel structures 120d. As shown in FIG. 1 and FIG. 3, since the first string select line cut 105a and a portion of the stack structure 202 are included between the first sub-slits 12a1, 12a2, 12a3, 12a4, and 12a5 have, it can strengthen the mechanical strength of the whole memory device 1 between second slits 12b, thereby reducing the bending issue of the stack structure 202 of the memory device 1. Further, in some embodiments, a bottommost conductive layer 126b may be used as a ground select line (GSL) to be electrically connected to a ground transistor.

Figure 4:
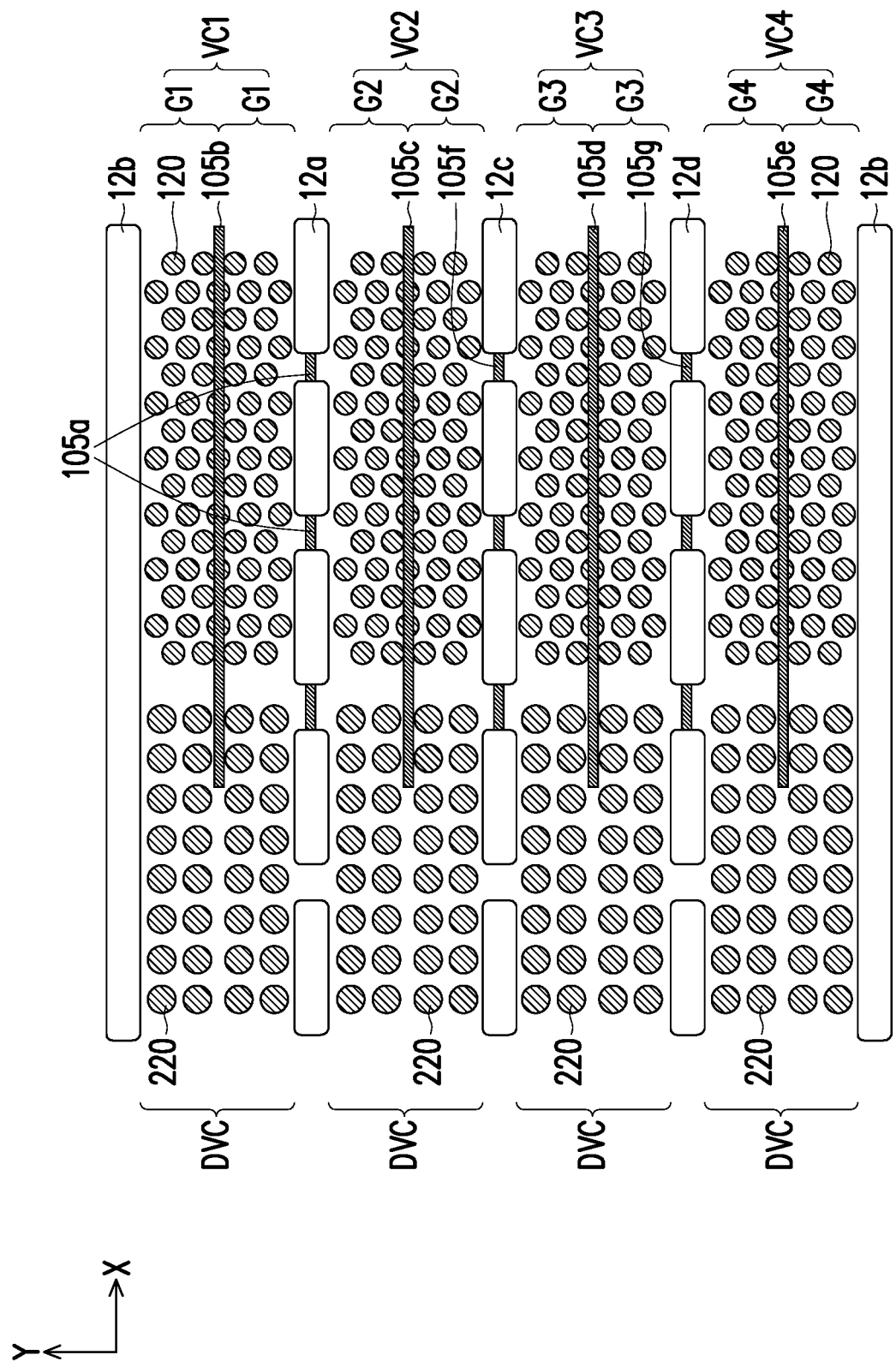
FIG. 4 is a schematic top view of a memory device according to a second embodiment of the invention.

FIG. 4 is a schematic top view of a memory device according to a second embodiment of the invention.

Referring to FIG. 4, a memory device 2 of the second embodiment is similar to the memory device 1 of the first embodiment. The main difference between two embodiments is that the memory device 2 includes a third set of vertical channel structures VC3, a fourth set of vertical channel structures VC4, a third slit 12c, and a fourth slit 12d. The first, second, third, and fourth set of vertical channel structures VC1, VC2, VC3, and VC4 are arranged along the Y direction. In some embodiments, the third set of vertical channel structures VC3 and the fourth set of vertical channel structures VC4 also include the plurality of vertical channel structures 120. The vertical channel structures 120 penetrate through the stack structure 202 to contact the substrate 100.

As shown in FIG. 4, the third slit 12c is disposed between the second set of vertical channel structures VC2 and the third set of vertical channel structures VC3, and penetrates through the stack structure 202 to expose the substrate 100. The fourth slit 12d is disposed between the third set of vertical channel structures VC3 and the fourth set of vertical channel structures VC4, and penetrates through the stack structure 202 to expose the substrate 100. The third slit 12c and the fourth slit 12d both extend from the array region R1 to the stair-step region R2 along the X direction. It should be noted that the third slit 12c includes a plurality of third sub-slits arranged discretely along the X direction, and a sixth string select line cut 105f is located between the third sub-slits. The fourth slit 12d also includes a plurality of fourth sub-slits arranged discretely along the X direction, and a seventh string select line cut 105g is located between the fourth sub-slits. In the case, the sixth string select line cut 105f and a portion of the stack structure 202 between the third sub-slits and the seventh string select line cut 105g and a portion of the stack structure 202 between the fourth sub-slits can further strengthen the mechanical strength of the whole memory device 2, thereby reducing the bending issue of the stack structure 202 of the memory device 2. Although the first string select line cut 105a, the sixth string select line cut 105f, and the seventh string select line cut 105g shown in FIG. 4 correspond to each other, the present invention is not limited thereto. In other embodiments, the first string select line cut 105a, the sixth string select line cut 105f, and the seventh string select line cut 105g may be disposed in a staggered configuration.

Moreover, the memory device 2 includes a fourth string select line cut 105d and a fifth string select line cut 105e. The fourth string select line cut 105d extends along the X direction to divide the third set of vertical channel structures VC3 into two third groups G3. The fifth string select line cut 105e extends along the X direction to divide the fourth set of vertical channel structures VC4 into two fourth groups G4. Each third group G3 or each fourth group G4 has the same number of vertical channel structures 120.

In summary, in the embodiment of the present invention, the continuously extending first slit is replaced with the plurality of first sub-slits arranged discretely along the X direction. In the case of the stack structure with a high aspect ratio, the first string select line cut and a portion of the stack structure between the first sub-slits is able to strengthen the mechanical strength of the memory device, so as to reduce the bending issue of the stack structure during a series of processes (e.g., a wet etching processes, a film deposition process, a thermal process, or the like), thereby enhance the yield and reliability of the memory device. In addition, the first sub-slits and the first string select line cuts therebetween may be regarded as an isolation structure to electrically separate the first set of vertical channel structures from the second set of vertical channel structures, thereby increasing the flexibility of the operation of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
   a stack structure, disposed on a substrate;
   a first set of vertical channel structures and a second set of vertical channel structures, arranged along a Y direction parallel to a top surface of the substrate and penetrating through the stack structure to contact the substrate;
   a first slit, disposed between the first and second sets of vertical channel structures, and penetrating through the stack structure to expose the substrate, wherein the first slit comprises a plurality of first sub-slits discretely disposed along a X direction parallel to the top surface of the substrate; and
   a first string select line cut, between the plurality of discrete first sub-slits along the X direction.

2. The memory device according to claim 1, wherein the substrate comprises an array region and a stair-step region, the first and second sets of vertical channel structures are disposed on the substrate in the array region.

3. The memory device according to claim 2, wherein the first string select line cut extends at least beyond a first column of contacts in the stair-step region.

4. The memory device according to claim 1, wherein the stack structure comprises a plurality of conductive layers and a plurality of dielectric layers stacked alternately along a Z direction, a topmost conductive layer is a string select line to control a switch of the first and second sets of vertical channel structures.

5. The memory device according to claim 4, further comprising:
   a second string select line cut embedded in the string select line and extending along the X direction to divide the first set of vertical channel structures into two first groups; and
   a third string select line cut embedded in the string select line and extending along the X direction to divide the second set of vertical channel structures into two second groups.

6. The memory device according to claim 2, further comprising:
   two second slits respectively disposed at a first side of the first set of vertical channel structures and a second side of the second set of vertical channel structure which opposite to the first side, and the two second slits penetrating through the stack structure to expose the substrate, wherein the two second slits continuously extend from the array region into the stair-step region along the X direction respectively.

7. The memory device according to claim 6, wherein a length of one of the two second slits is greater than a sum of lengths of the plurality of first sub-slits.

8. The memory device according to claim 6, wherein a ratio of a sum of lengths of the plurality of first sub-slits to a length of one of the two second slits is in a range of 0.35 to 0.9.

9. The memory device according to claim 1, further comprising:
   a third set of vertical channel structures arranged along the Y direction with the first and second sets of vertical channel structures and penetrating through the stack structure to contact the substrate; and
   a third slit, disposed between the second and third sets of vertical channel structures, and penetrating through the stack structure to expose the substrate, wherein the third slit comprises a plurality of third sub-slits discretely disposed along the X direction.

10. The memory device according to claim 9, further comprising:
    a fourth string select line cut embedded in a string select line and disposed between the plurality of third sub-slits.

11. A method of manufacturing the memory device of claim 1, comprising:
    forming a stack layer on a substrate, wherein the stack layer comprises a plurality of first materials and a plurality of second materials;
    forming a string select line cut extending along a X direction in a topmost second material;
    respectively forming a first set of vertical channel structures and a second set of vertical channel structures at two sides of the string select line cut, the first and second sets of vertical channel structures arranging along a Y direction parallel to a top surface of the substrate and penetrating through the stack layer to contact the substrate; and
    forming a first slit between the first and second sets of vertical channel structures, wherein the first slit penetrates through the stack structure to expose the substrate, the first slit comprises a plurality of first sub-slits discretely disposed along the X direction parallel to the top surface of the substrate, and the string select line cut is divided into a plurality of first string select line cuts by the firs slit, wherein the plurality of first string select line cuts is located between the plurality of first sub-slits and discretely disposed along the X direction.

12. The method of manufacturing the memory device according to claim 11, further comprising:
    performing an etching process to remove the plurality of second materials, so as to form a plurality of gaps between the plurality of first materials; and
    forming a plurality of conductive layers in the plurality of gaps, so that the plurality of conductive layers surround the first and second sets of vertical channel structures.

13. The method of manufacturing the memory device according to claim 11, wherein the forming the string select line cut comprising:
    forming a second string select line cut to divide the first set of vertical channel structures into two first groups; and
    forming a third string select line cut to divide the second set of vertical channel structures into two second groups.

14. The method of manufacturing the memory device according to claim 13, wherein the substrate comprises an array region and a stair-step region, the first and second sets of vertical channel structures are formed on the substrate in the array region, and the plurality of first string select line cuts and the first slit are formed to extend from the array region into the stair-step region.

15. The method of manufacturing the memory device according to claim 14, wherein the forming the first slit comprises:
    respectively forming two second slits at a first side of the first set of vertical channel structures and a second side of the second set of vertical channel structure which opposite to the first side, the two second slits penetrating through the stack layer to expose the substrate, wherein the two second slits continuously extend from the array region into the stair-step region along the X direction respectively.

16. The method of manufacturing the memory device according to claim 14, wherein the forming the first and second sets of vertical channel structures comprises:

forming a plurality of sets of dummy vertical channel structures penetrating through the stack layer in the stair-step region to contact the substrate in the stair-step region.

17. The method of manufacturing the memory device according to claim 11, wherein the plurality of first string select line cuts and the plurality of second materials have different materials or materials with different etching selectivies.

18. A memory device, comprising:

a stack structure, disposed on a substrate;

a first set of vertical channel structures and a second set of vertical channel structures, arranged along a Y direction and penetrating through the stack structure to contact the substrate;

an isolation structure, disposed between the first and second sets of vertical channel structures, wherein the isolation structure comprises a plurality of sub-slits and a plurality of string select line cuts arranged alternately along a X direction; and a second slit, disposed at a first side of the first set of vertical channel structures and penetrating through the stack structure to expose the substrate, wherein the second slit continuously extends along the X direction, and a length of the second slit is greater than a sum of lengths of the plurality sub-slits.

\* \* \* \* \*